United States Patent [19]

Okuyama et al.

[11] Patent Number: 5,740,193
[45] Date of Patent: Apr. 14, 1998

[54] SEMICONDUCTOR LIGHT-EMITTING DEVICE

[75] Inventors: Hiroyuki Okuyama; Akira Ishibashi; Eisaku Kato, all of Kanagawa; Hiroshi Yoshida; Kazushi Nakano, both of Tokyo; Masakazu Ukita, Kanagawa; Satoru Kijima, Kanagawa; Sakurako Okamoto, Kanagawa, all of Japan

[73] Assignee: Sony Corporation, Tokyo, Japan

[21] Appl. No.: 832,065

[22] Filed: Apr. 2, 1997

Related U.S. Application Data

[63] Continuation of Ser. No. 508,966, Jul. 28, 1995, Pat. No. 5,657,336.

[30] Foreign Application Priority Data

Jul. 29, 1994 [JP] Japan .................. 6-178773
Feb. 3, 1995 [JP] Japan .................. 7-017327

[51] Int. Cl.$^6$ ........................... H01S 3/19
[52] U.S. Cl. ............... 372/45; 257/101; 257/94; 257/103
[58] Field of Search .............. 372/45; 257/94.96, 257/97.103, 101

[56] References Cited

U.S. PATENT DOCUMENTS

| | | | |
|---|---|---|---|
| 4,318,059 | 3/1982 | Lang et al. | 372/50 |
| 4,955,031 | 9/1990 | Jain | 372/45 |
| 4,977,561 | 12/1990 | Ibe et al. | 372/23 |
| 5,274,248 | 12/1993 | Yokogawa et al. | 257/97 |
| 5,291,507 | 3/1994 | Haase et al. | 372/44 |
| 5,296,718 | 3/1994 | Fujita et al. | 372/45 |
| 5,373,521 | 12/1994 | Takahashi | 372/45 |
| 5,471,067 | 11/1995 | Ikeda et al. | 257/94 |

Primary Examiner—Rodney B. Bovernick
Assistant Examiner—Yisun Song
Attorney, Agent, or Firm—Hill & Simpson

[57] ABSTRACT

A II–VI group compound semiconductor light-emitting device can emit light of a short wavelength at room temperature. Operation characteristics, such as current—voltage characteristics and current—light output characteristics can be stabilized and a life of this semiconductor light-emitting device can be extended. The semiconductor light-emitting device comprises a substrate (1), at least a first cladding layer (2) of a first conductivity type, an active layer (3) and a second cladding layer (4) of a second conductivity type, wherein at least the active layer (3) is made of a II–VI group compound semiconductor and the active layer (3) is doped by either or both of n-type and p-type dopants.

9 Claims, 8 Drawing Sheets

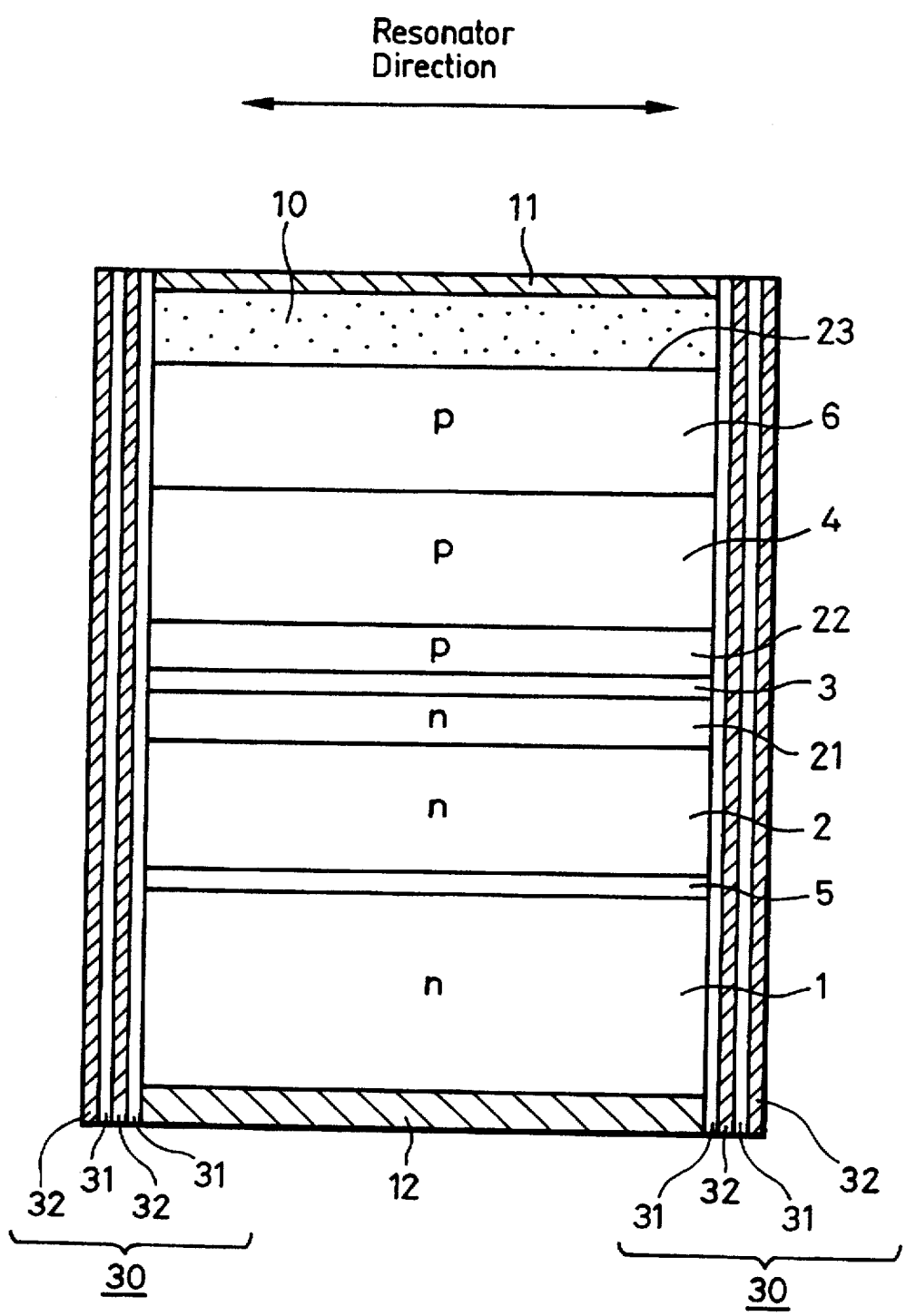

5,740,193

1

SEMICONDUCTOR LIGHT-EMITTING DEVICE

This is a continuation, of application Ser. No. 08/508,966, filed Jul. 28, 1995 now U.S. Pat. No. 5,657,336.

BACKGROUND OF THE INVENTION

The present invention relates to a semiconductor light-emitting device, e.g., a laser diode or light-emitting diode formed of II–VI group compound semiconductor, for example.

In order to record and/or reproduce an optical disk and a magneto-optical disk at high density with high resolution, there is an increasing demand for a green or blue semiconductor laser which can emit green or blue light of a short wavelength.

Japan Journal of Applied Physics Vol. 31 (1992) pp. L340 to L342 described a semiconductor laser having a DH (double hetero) structure composed of a ZnSe active layer and a ZnMgSSe cladding layer can be photo-excited to oscillate at room temperature. An oscillation wavelength of the semiconductor laser having the ZnSe active layer was 475.0 nm.

Further, Japan Journal of Applied Physics Vol. 33 (1994), pp. L938 to L940 described a semiconductor laser having a SCH (separate confinement heterostructure) composed of a ZnCdSe active layer, a ZnSSe guide layer and a ZnMgSSe cladding layer.

In the above-mentioned two semiconductor lasers, the active layers thereof are not doped.

In the II–VI group compound semiconductor light-emitting device composed of at least one kind of II-group elements, such as Zn, Hg, Cd, Mg or Be and one kind of VI-group elements, such as S, Se or Te, many non-radiative recombination centers exist on the active layer which is the light-emitting layer, thereby causing a current—light output characteristic and a current—voltage characteristic to be lowered. As a result, the semiconductor light-emitting device becomes unreliable.

As factors that act as the non-radiative recombination centers, there are enumerated dislocations such as a misfit dislocation or a threading dislocation, a stacking fault, a point defect and a cluster thereof, each of which has a dangling bond.

A degradation nucleus of the above semiconductor light-emitting device causes the non-radiative portion to be enhanced through a so-called non-radiative recombination enhanced defect motion (referred to hereinafter as NRREDM). There is then the problem that the operation characteristic is lowered. In particular, if the point defect exists with high density or the point defect forms a cluster, then the point defect tends to act as a degradation nucleus. Further, the point defect not only acts as the degradation nucleus but also moves due to NRREDM, i.e., assumes the degradation process. Therefore, the point defect plays a very important role in degradation of the semiconductor light-emitting device.

Of the aforesaid degradation nuclei, the dislocation such as misfit dislocation and threading dislocation and the stacking fault which are giant defects can be improved based on a substrate used, a substrate treatment, a semiconductor layer structure and a crystal growth condition, i.e., they are external causes. However, the point defect occurs based on the crystal growth condition or the like as an external cause but the point defect intrinsically exists in order to lower a free energy based on thermodynamics. These point defects are difficult to be reduced. At the same time, the deterioration caused by these point defects has to be suppressed.

SUMMARY OF THE INVENTION

It is therefore an object of the present invention to provide a II–VI group compound semiconductor light-emitting device which can emit light of a short wavelength at room temperature.

It is another object of the present invention to provided a II–VI group compound semiconductor light-emitting device in which operation characteristics, such as current—voltage characteristics and current—light output characteristics can be stabilized.

It is a further object of the present invention to provide a II–VI group compound semiconductor light-emitting device whose life can be extended.

According to an aspect of the present invention, there is provided a semiconductor light-emitting device which is comprised of a substrate, at least a first cladding layer of a first conductivity type, an active layer, and a second cladding layer of a second conductivity type, the first cladding layer, the active layer and the second cladding layer being formed on the substrate, wherein at least the active layer is formed of a II–VI group compound semiconductor and the active layer is doped by at least one of n-type and p-type dopants.

According to another aspect of the present invention, there is provided a semiconductor light-emitting device which oscillates at room temperature. This semiconductor light-emitting device is comprised of a substrate, at least a first cladding layer of a first conductivity type, an active layer, and a second cladding layer of a second conductivity type, wherein the active layer is made of ZnSe, the first and second cladding layers are made of ZnMgSSe and the active layer is doped by Cl.

BRIEF DESCRIPTION OF THE DRAWINGS

FIG. 10 is a schematic cross-sectional view showing a semiconductor light-emitting device according to a third embodiment of the present invention.

DETAILED DESCRIPTION OF THE PREFERRED EMBODIMENTS

A semiconductor light-emitting device according to a first embodiment of the present invention will hereinafter be described with reference to FIG. 1.

Figure 1:
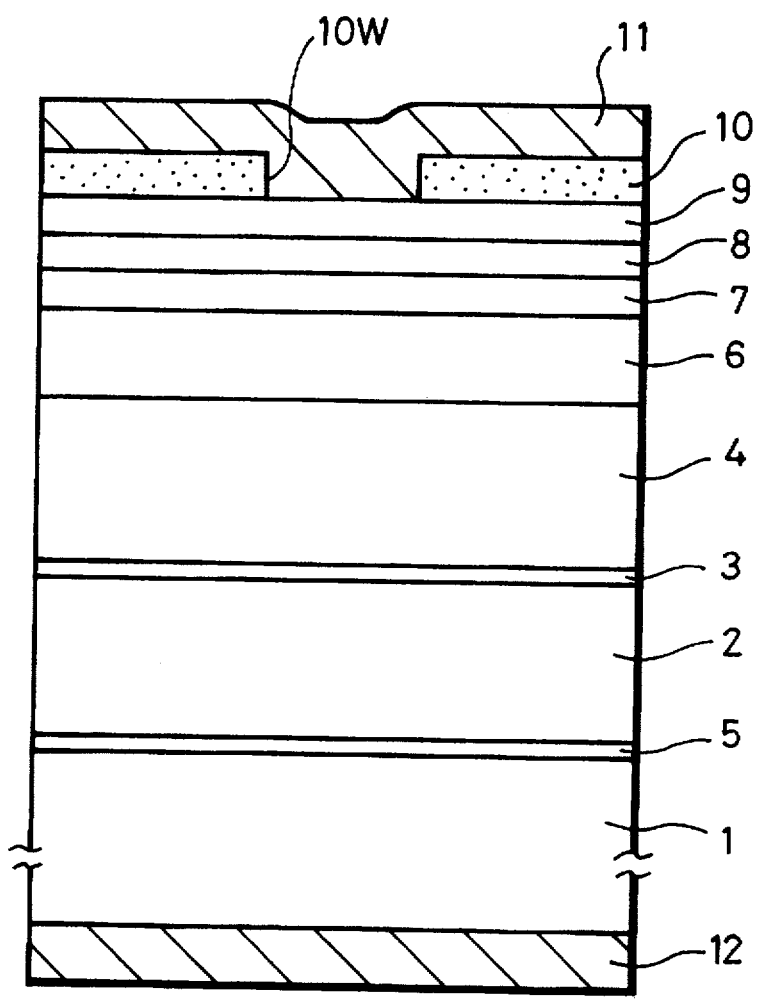
FIG. 1 is a schematic cross-sectional view showing a semiconductor light-emitting device according to a first embodiment of the present invention.

According to this embodiment, as shown in FIG. 1, a II–VI group compound semiconductor, e.g., semiconductor laser is formed on a GaAs substrate 1 by epitaxially growing a ZnMgSSe II–VI group compound semiconductor layer.

Figure 2:
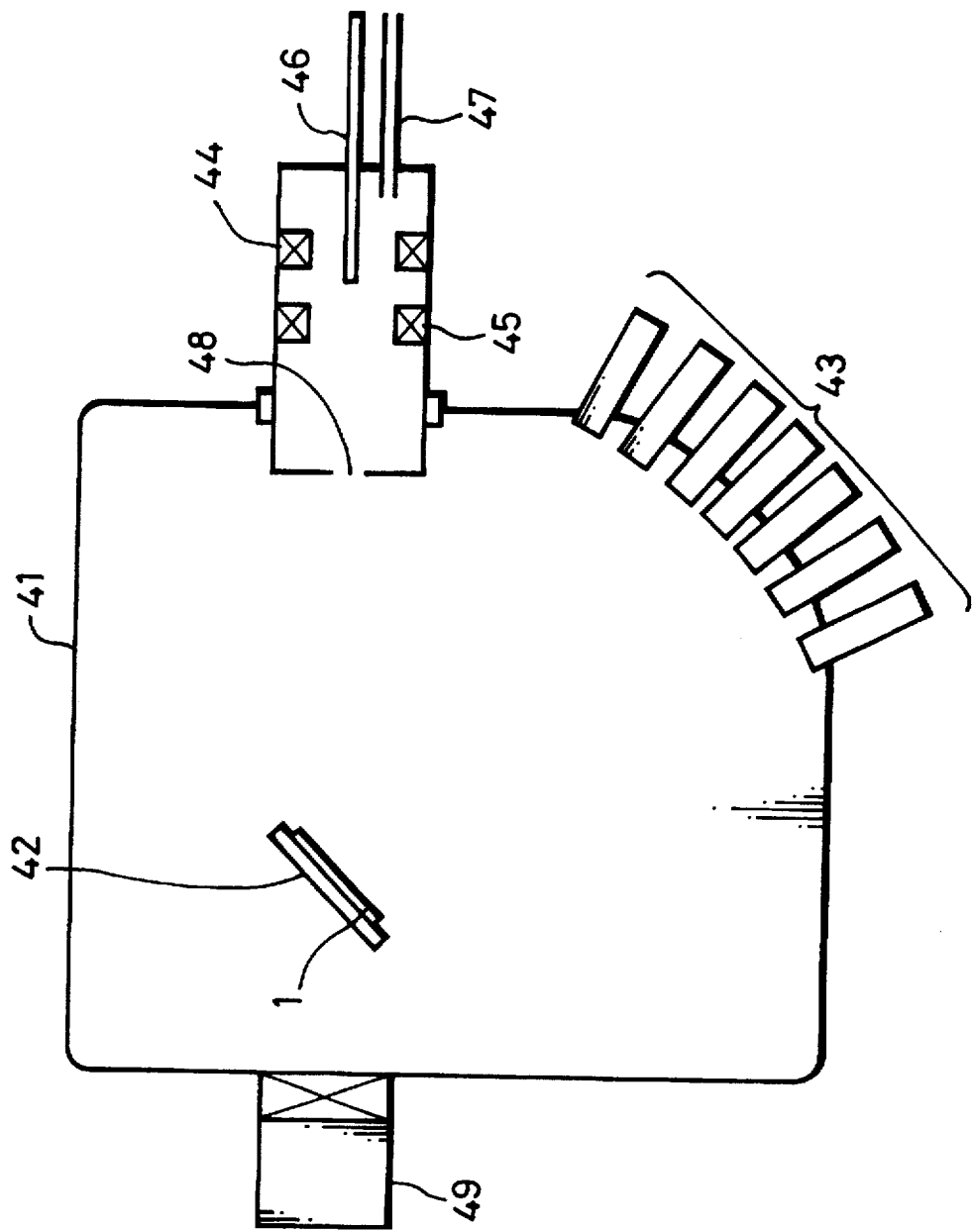
FIG. 2 is a schematic diagram showing an example of a molecular beam epitaxy apparatus used in the present invention.

Semiconductor layers were epitaxially grown on the substrate 1 by a MBE (molecular beam epitaxy) apparatus. FIG. 2 shows a schematic arrangement of the MBE apparatus. The MBE apparatus is a kind of vacuum deposition apparatus and includes a vacuum chamber 41 having a ultra-high vacuum exhausting apparatus (not shown). In this chamber 41, there is disposed a substrate holder 42 for holding a substrate 1 on which a II–VI group compound semiconductor is formed.

Within the chamber 41, there are disposed a plurality of molecular beam sources (K cells) 43 in an opposing relation to the substrate 1. The molecular beam sources 43 are material sources for the II–VI group compound semiconductor. The chamber 41 includes a plasma generating chamber 44 which radiates plasma N (nitrogen) to the substrate 1. This plasma generating chamber 44 is of an ECR (electron cyclotron resonance) cell arrangement. The plasma generating chamber 44 includes a magnet 45, a microwave terminal 46 for supplying microwaves and a nitrogen gas introducing tube 47 for supplying a nitrogen gas.

According to this MBE apparatus, a II–VI group compound semiconductor is epitaxially grown on the substrate 1 by radiation of molecular beams from the II–VI group compound semiconductor material molecular beam source of the molecular beam source 43 to the substrate 1.

When a nitrogen-doped p-type II–VI group compound semiconductor is epitaxially grown on the substrate 1, a nitrogen gas is generated as plasma nitrogen N according to the ECR (electron cyclotron resonance) energized on application of a magnetic field and a microwave in the plasma generating apparatus 44. The plasma nitrogen N is introduced through a plasma introducing inlet 48 into the plasma generating chamber 44 to radiate the substrate 1 together with radiation of molecular beams. Then, the nitrogen-doped, i.e., p-type II–VI group compound semiconductor can be epitaxially grown by radiating the substrate 1 with molecular beams from the molecular beam source 43.

When a Cl-doped n-type II–VI group compound semiconductor is epitaxially grown on the substrate 1, a Cl-doped n-type II–VI group compound semiconductor can be epitaxially grown on the substrate 1 by radiation of molecular beams from the II–VI group compound semiconductor material molecular beam source of the molecular beam source 43 and from the Cl molecular beam source to the substrate 1.

The semiconductor light-emitting device shown in FIG. 1 is formed by using this epitaxial growth apparatus. In this case, as shown in FIG. 1, on a first conductivity type, e.g., n-type GaAs substrate 1, there is epitaxially grown a ZnSe buffer layer 5 on which there are epitaxially grown a first cladding layer 2 having a thickness of about 1 μm of a first conductivity type made of ZnMgSSe doped by Cl as n-type impurity, a ZnSe active layer 3 having a thickness of about 70 nm and a second cladding layer 4 having a thickness of about 1 μm of a second conductivity type, in this embodiment, ZnMgSSe doped by N (nitrogen) of p-type impurity, in that order.

On the second cladding layer 4, there are grown respective layers to make a satisfactory ohmic-contact with a p-side electrode by continuous epitaxy. A first semiconductor layer 6 having a thickness of about 200 nm made of ZnSSe doped by N of first conductivity type, i.e., p-type impurity, a second semiconductor layer 7 having a thickness of about 700 nm made of ZnSe, a superlattice structure semiconductor layer 8 in which N-doped ZnTe and ZnSe are alternately laminated and a contact layer 9 made of N-doped ZnTe are epitaxially grown on the second cladding layer 4, in that order.

On the contact layer 9, there is deposited an insulating layer 10 of polyimide or the like. An opening 10W is bored on a current path portion of a stripe-shaped pattern extending in the direction perpendicular to the sheet of drawing of FIG. 1 by a suitable process, such as photolithography. Thereafter, a p-side electrode 11 having a laminated structure in which Pd having a thickness of about 10 nm, Pt having a thickness of 100 nm and Au having a thickness of 300 nm are deposited on the whole surface from the contact layer 9 side is formed on the contact layer 9 through the opening 10W of the insulating layer 10 so as to make an ohmic contact.

Further, an electrode 12 such as In is deposited on the rear surface side of the substrate 1, thereby a semiconductor light-emitting device, e.g., semiconductor laser being formed.

The active layer 3 is doped by either or both of n-type and p-type dopants, i.e., impurity. A concentration of dopant in the active layer 3 is selected to be $1 \times 10^{15}/\text{cm}^{-3}$ or greater. At that time, a point defect density can be controlled and a degradation velocity can be controlled so that the life of the semiconductor light-emitting device can be extended.

The active layer 3 is made of ZnSe, for example, and doped by Cl with a dopant atomic concentration of $1 \times 10^{15}$ to $5 \times 10^{16} \text{cm}^{-3}$ as n-type dopant. As a Cl doping material, there can be used $ZnCl_2$ serving as Cl impurity source of one of the molecular beam sources 43 shown in FIG. 2.

Figure 3:
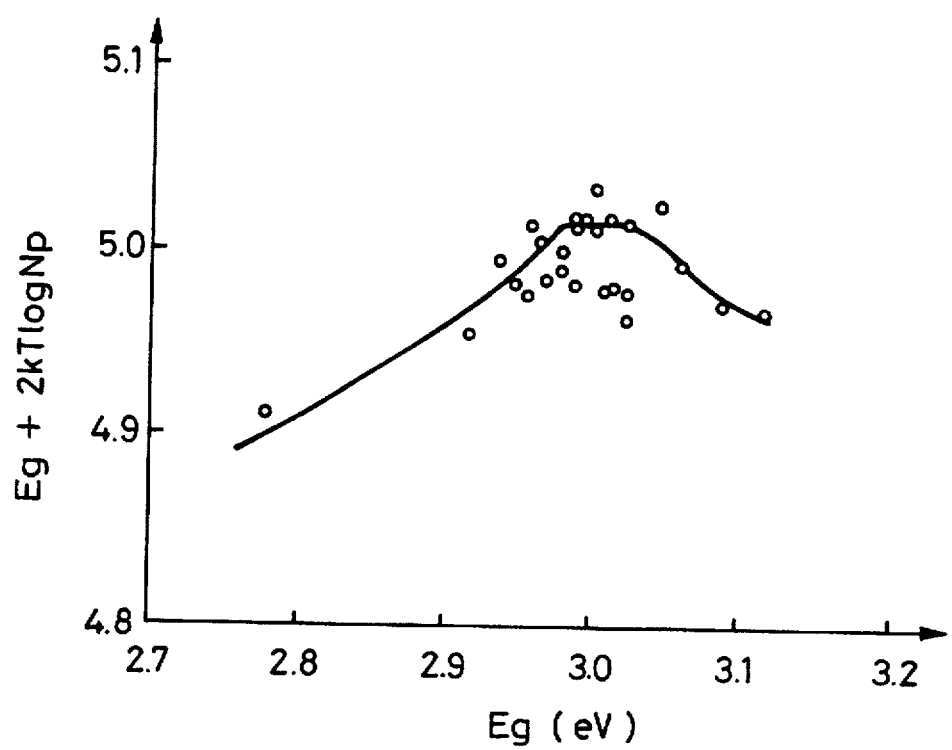
FIG. 3 is a characteristic graph showing a relationship between band gap and hole concentration.

A bandgap energy (at 77K) Eg of the cladding layer, in particular, the p-type cladding layer 4 is selected so as to satisfy Eg=3.0 eV±0.05 eV. FIG. 3 shows a relationship between a bandgap energy Eg and a hole concentration $N_p$ ($cm^{-3}$) obtained in Japanese patent application No. 5-288653 proposed by the same assignee of this application under the title of "Semiconductor Laser". In FIG. 3, reference letter T denotes a semiconductor laser operation temperature (K) and k denotes a Boltzmann constant (eV/K). Study of FIG. 3 reveals that the bandgap energy Eg of the p-type cladding layer 4 should preferably be selected so as to satisfy Eg=3.0 eV±0.05 eV in order to obtain a high hole concentration.

Figure 4:
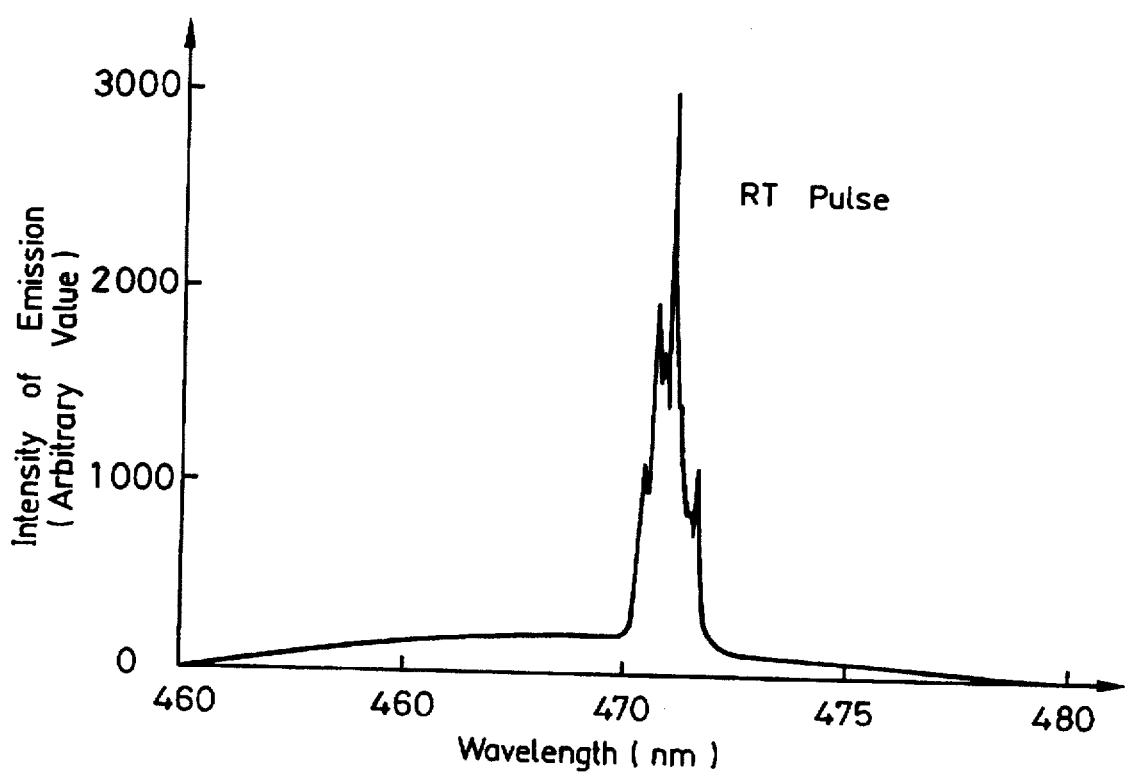
FIG. 4 is a spectrum diagram showing measured results of light emitted from the semiconductor light-emitting device according to the present invention.

FIG. 4 is a spectrum diagram showing measured results of oscillation of the inventive semiconductor laser shown in FIG. 1 wherein the active layer 3 is made of n-type Cl-doped ZnSe. In that case, the semiconductor laser emitted laser beam having a wavelength of 471 nm and its half-amplitude level presented a narrow and steep oscillation spectrum. A threshold current density was 20 kA/cm².

While the semiconductor laser in which the active layer 3 is made of ZnSe which is not doped by impurity could not emit laser beam at room temperature, according to the present invention, the semiconductor laser having the ZnSe active layer 3 can emit laser beam having a short wavelength of 471 nm at room temperature.

Figure 5:
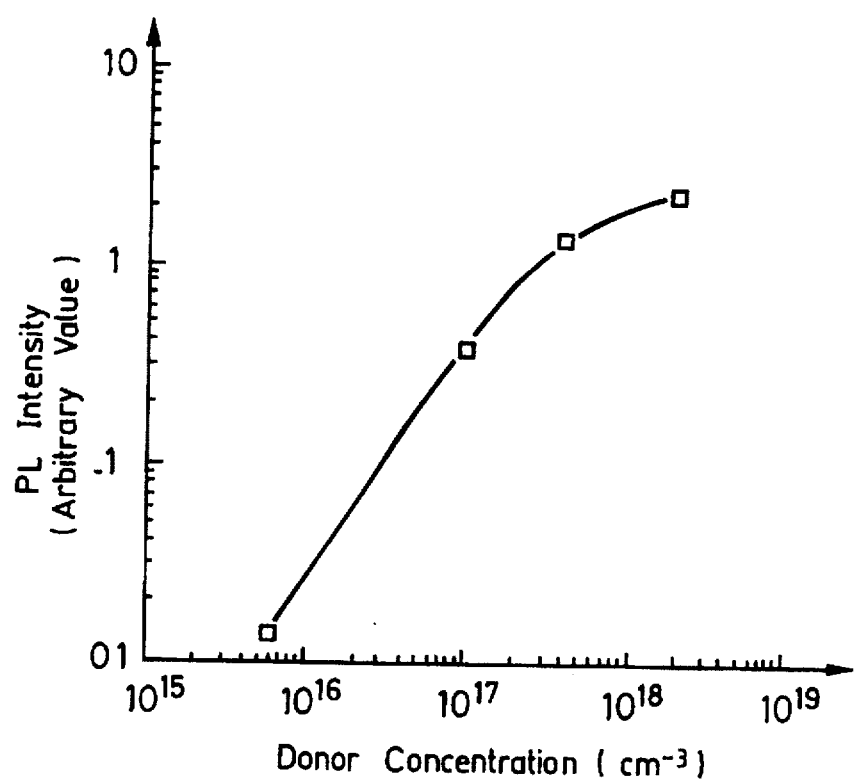
FIG. 5 is a graph showing an impurity concentration dependence relative to a PL (photoluminescence) light-emission intensity and which is used to explain the present invention.
Figure 6:
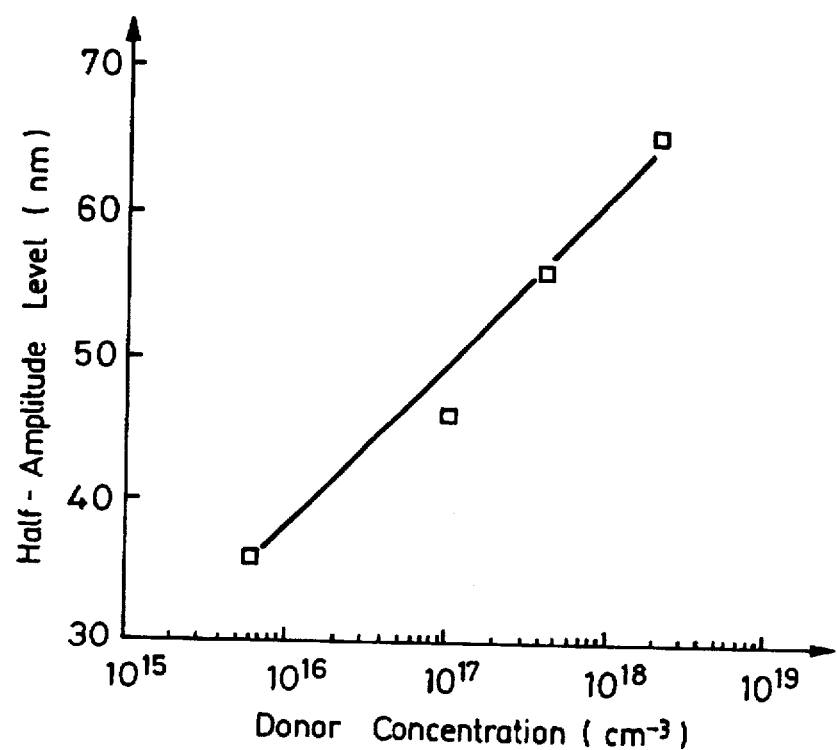
FIG. 6 is a graph showing an impurity concentration dependence of a half-amplitude level relative to a PL light-emitting spectrum and which is used to explain the present invention.

FIGS. 5 and 6 show measured results of light-emitting intensity of PL (photoluminescence) based on photo-excitation and half-amplitude level of PL light-emission spectrum obtained when an atomic concentration (cm$^{-3}$) of dopant in the Cl-doped ZnSe is changed in the PL where ZnSe is epitaxially grown on the GaAs Substrate, respectively.

Study of FIGS. 5 and 6 shows that PL intensity can be increased by increasing the dopant concentration and that the point defect density and the degradation velocity can be suppressed, accordingly, the life of the semiconductor laser can be extended as will be described later on. On the other hand, if the atomic concentration of dopant exceeds $1\times10^{15}$ cm$^{-3}$, then the half-amplitude level increases. Thus, the light-emitting operation current and a threshold current $I_{th}$ tend to increase. However, when the atomic concentration of dopant is selected to be $1\times10^{15}$ to $5\times10^{16}$ cm$^{-3}$, the effect achieved by the increase of PL intensity excels the effect achieved by the increase of half-amplitude level. Therefore, the semiconductor laser using the ZnSe active layer became able to emit laser beam of a short wavelength at room temperature. Moreover, since the light-emitting efficiency can be improved, it became possible to lower the operation current and the threshold current.

As described above, when the atomic concentration of the n-type dopant in the active layer was selected to be $1\times10^{15}$ to $5\times10^{16}$ cm$^{-3}$, the light-emitting efficiency could be improved and the threshold current $I_{th}$ could be lowered. The reason that the dopant concentration is selected to be $1\times10^{15}$ cm$^{-3}$ or higher is that, if the dopant concentration is less than $1\times10^{15}$ cm$^{-3}$, then the semiconductor laser using the ZnSe active layer can not emit laser beam at room temperature and that a light-emitting intensity in a semiconductor laser using a ZnCdSe active layer is low. This is because a non-radiative center increases when the active layer is not doped by dopant.

While the active layer 3 is doped by Cl as described above, it is possible to dope the active layer 3 by using ZnCl$_2$ as a dopant material when the active layer is epitaxially grown, e.g., as one of the molecular beam sources 43 in the MBE apparatus shown in FIG. 2.

Since the active layer can be doped by Cl according to the molecular beam source based on ZnCl$_2$, an active layer having an excellent crystallinity can be epitaxially grown easily as compared with the case that a dopant is processed as a plasma dopant for doping the active layer.

While the semiconductor laser has the so-called DH structure wherein the active layer 3 is directly sandwiched between the first and second cladding layers 2 and 4 according to the first embodiment shown in FIG. 1, the present invention is not limited thereto and can also be applied to a semiconductor laser of SCH structure in which first and second guide layers are interposed among an active layer and first and second cladding layers.

Figure 7:
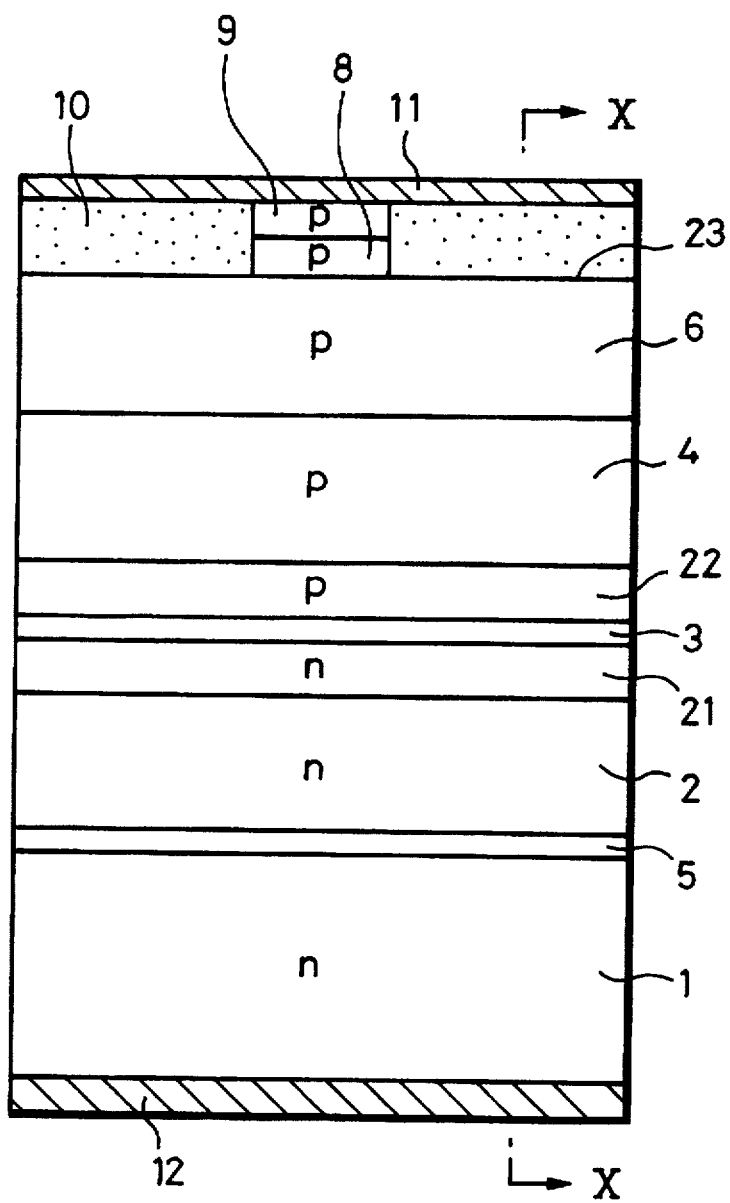
FIG. 7 is a schematic cross-sectional view showing a semiconductor light-emitting device according to a second embodiment of the present invention.

A second embodiment according to the present invention wherein a semiconductor light-emitting device is applied to a semiconductor light-emitting device having a SCH structure will be described with reference to FIG. 7. In FIG. 7, like parts corresponding to those of FIG. 1 are marked with the same references.

Also in this embodiment, on the first conductivity type, e.g., n-type GaAs substrate 1, there are epitaxially grown the ZnSe buffer layer 5, the ZnMgSSe first cladding layer 2 doped by Cl as a first conductivity type, e.g., n-type impurity, a ZnSSe first guide layer 21 doped by Cl as a first conductivity type, e.g., n-type impurity, the ZnCdSe active layer 3 doped by Cl as a first conductivity type, e.g., n-type impurity, a ZnSSe second guide layer 22 doped by N (nitrogen) of a second conductivity type, e.g., n-type impurity and the second cladding layer 4 doped by N (nitrogen) of a second conductivity type, in that order.

Subsequently, on the second cladding layer 4, there are epitaxially continuously grown respective layers in order to make a satisfactory ohmic contact. In this embodiment, on the ZnSSe first semiconductor layer (capping layer) 6 doped by N (nitrogen) as a second conductivity type, e.g., p-type impurity, there are epitaxially grown the superlattice structure semiconductor layer 8 wherein N-doped ZnTe and ZnSe are alternately laminated and the contact layer 9 made of N-doped ZnTe or the like, in that order.

In this embodiment, a groove 23 crossing the contact layer 9 and the superlattice structure semiconductor layer 9 are formed on the first semiconductor layer 6 at both sides of a central stripe portion by selective etching based on photo-lithography. An Al$_2$O$_3$, for example, is deposited on the whole surface including the inside of the groove 23 from the etching resist used in the selective etching by vapor deposition, for example. Then, Al$_2$O$_3$ in the stripe portion is lifted off by the removal of the etching resist, whereby the insulating layer 10 made of Al$_2$O$_3$ is selectively filled into the groove 23 to form a current confinement layer. Moreover, the contact layer 9 of the stripe portion is exposed to the outside.

Thereafter, Pd, Pt or Au, for example, is similarly deposited on the whole surface of the contact layer 9 side by vapor deposition to thereby form the p-side electrode 11 having the laminated structure to make an ohmic-contact with the contact layer 9.

Further, the electrode 12 such as In is also deposited on the rear surface side of the substrate 1, thereby the semiconductor light-emitting device, e.g., semiconductor laser being formed.

Figure 8:
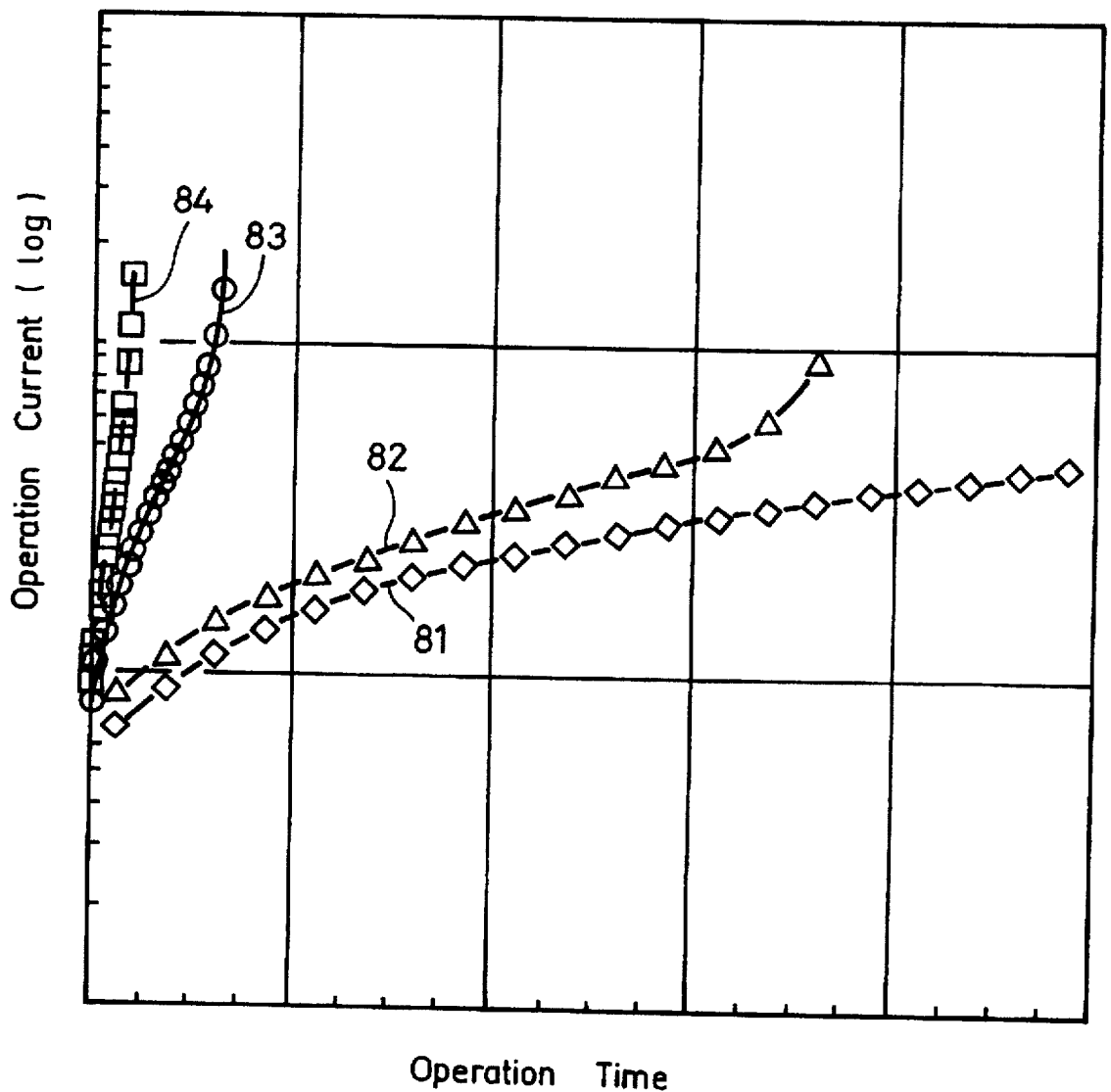
FIG. 8 is a characteristic graph showing measured results of operation currents—voltage characteristics of the inventive semiconductor light-emitting device and the conventional semiconductor light-emitting device.

FIG. 8 shows measured results of operation current characteristics versus to an operation time obtained when the semiconductor laser device arranged as shown in FIG. 7 is continuously operated at room temperature where an intensity of light output is 0.1[mW]. Characteristic curves 81 and 82 in FIG. 8 plot measured results of operation currents concerning two semiconductor laser devices wherein the active layer 3 is doped by Cl with a dopant concentration of 10$^{17}$ cm$^{-3}$. Characteristics 83 and 84 in FIG. 8 plot similar measured results concerning two semiconductor laser devices having the SCH structures similar to the structure shown in FIG. 7 and wherein the active layer 3 is not doped by dopant. Having compared the inventive semiconductor laser devices and the conventional semiconductor laser devices, it is to be understood that the semiconductor laser device according to the present invention could improve the deterioration of characteristics remarkably.

The reason for this is as follows. That is, according to the present invention, since the active layer is doped by impurity, a point defect density which becomes a non-radiative recombination center can be lowered. Further, since the point defect density is lowered and a cluster of point defect is suppressed, it is possible to avoid the occurrence of phenomenon wherein a non-radiative portion is enhanced through the NRREDM when the point defect acts as a degradation nucleus. Furthermore, since a slope of a defect density distribution in the active layer can be made gentle, a diffusion of point defect into the active layer can be suppressed.

If the concentration of dopant doped in the active layer 3 is selected to be higher than $1\times10^{17}$ cm$^{-3}$, for example, in excess of $1\times10^{15}$ cm$^{-3}$, then a vacancy density, i.e., point defect density can be lowered more reliably.

As described above, according to the arrangement of the present invention, since the point defect density can be lowered, the non-radiative recombination caused by this point defect can be lowered, thereby making it possible to improve the operation characteristic such as the current—light output characteristic an the current—voltage characteristic. When the point defects exists with a high density or the point defect forms the cluster as described before, the point defect tends to act as the degradation nucleus and moves due to the NRREDM, i.e., undertakes a degradation process. Therefore, since the point defect density can be lowered, the degradation of the operation characteristics such as light-emitting efficiency, current—light output characteristic and current—voltage characteristic can be avoided, i.e., the semiconductor light-emitting device can be made more reliable and the life of the semiconductor light-emitting device can be extended.

The deterioration of the above-mentioned characteristics occurs remarkably when the defect formed of the cluster of point defects is enhanced in the active layer from a dislocation of line defect, for example. The defect tends to increase when a vacancy of II-group atom and a vacancy of VI-group atom exit at the same time in the same number. According to the arrangement of the present invention, if one of charged vacancy of II-group atom, e.g., Zn and charged vacancy of VI-group atom, e.g., Se increases when a chemical potential is moved by doping impurity, then the other decreases. Therefore, the defect is difficult to be enhanced and the characteristics become difficult to be degraded.

Figure 9:
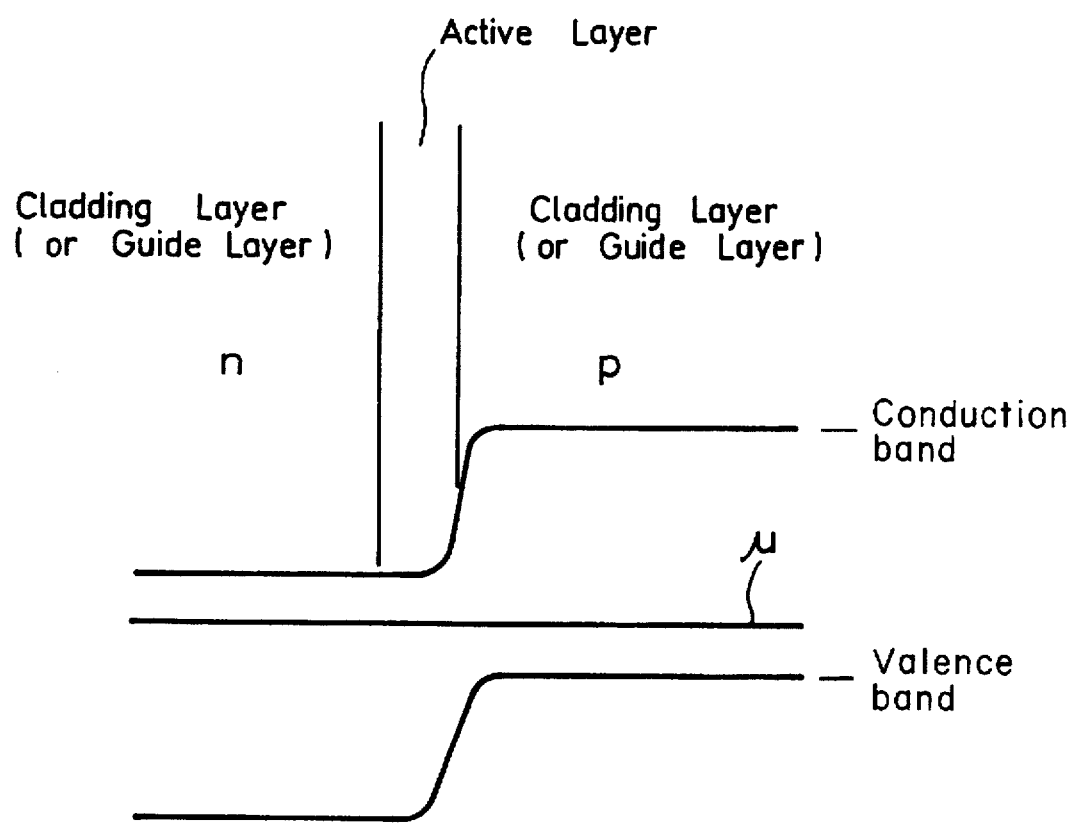
FIG. 9 is an energy band diagram used to explain the semiconductor light-emitting device according to the present invention.

Further, according to the above-mentioned arrangement, since the inclination of the point defect distribution in the active layer becomes gentle, the point defect becomes difficult to be diffused into the active layer to thereby suppress the characteristics of the active layer from being degraded much more. FIG. 9 shows a band model in the active layer and n-type and p-type cladding layers or guide layers obtained when the active layer is doped by the n-type dopant. In this case, since the active layer is doped by the n-type dopant, a chemical potential $\mu$ in this active layer becomes a flat level or gentle slope substantially the same as chemical potential of the n-type cladding layer or guide layer adjoining the active layer with the result that the distribution in the active layer of the point defect (vacancy), i.e., in the depletion layer becomes flat or gentle. Therefore, the point defect becomes difficult to be diffused in the active layer.

While the horizontal resonator is arranged such that its resonator length direction is extended in the layer surface direction of the active layer 3 and in the direction (direction perpendicular to the sheets of drawings of FIGS. 1 and 7) along the extended direction of the stripe-shaped electrode 11 in the first and second embodiments shown in FIGS. 1 and 7, as shown in a cross-sectional view of FIG. 10 taken along the line X—X in FIG. 7, a coating film 30 having a multi-layer structure composed of a first film 21 formed of an $Al_2O_3$ film and a second film 22 formed of a silicon (Si) film is deposited on both end faces, i.e., light-emitting end faces of the horizontal resonator to set a reflectivity and a transmittance on the end faces.

While the semiconductor light-emitting device emits light from the horizontal direction in the embodiments shown in FIGS. 1, 7 and 10, the present invention is not limited thereto and the semiconductor light-emitting device can be formed as a so-called surface emitting structure wherein the thickness of the electrode 11, for example, is selected to be less than 100 nm and light is emitted in the direction perpendicular to the surface of the active layer 3. Further, in order to improve the light-emitting efficiency, a Bragg reflector formed of a superlattice composed of Cl-doped ZnMgSSe thin film and ZnSSe thin film can be disposed between the substrate 1 and the first cladding layer 2. At that time, the contact layer 9 composed of the p-type ZnTe and the superlattice structure semiconductor layer 8 can be removed.

While the first conductivity type is the n-type and the second conductivity type is the p-type as described above, the present invention is not limited thereto and the first conductivity type may be the p-type and the second conductivity type may be the n-type. In addition, the present invention can be applied to various arrangements of II-VI group compound semiconductor light-emitting devices.

When the active layer is the ZnSe active layer, the semiconductor light-emitting device can emit light having a short wavelength, e.g., 471 nm. In addition, the light-emitting efficiency can be improved and the operation current can be lowered. The active layer can be made of ZnCdSe or other II-VI group compounds such as ZnSSe.

The dopant by which the active layer 3 is doped is not limited to any one of the n-type and p-type dopants but instead the vacancy, i.e., point defect density can be controlled and densities of vacancies of II-group atom and VI-group atom can be controlled by doping both the n-type and p-type dopants to predetermined densities.

If the n-type dopant for doping the active layer 3 is Cl, then the impurity can be made the same as the impurity of other n-type semiconductor layer such as the cladding layer, which is advantageous from a productivity standpoint. Since ion radius is smaller than that of host, e.g., ZnCdSe, the crystal can be solidified and the increase of dislocation due to the NRRED can be suppressed effectively. However, the dopant is not limited to the Cl and Ga also can be used.

The dopant for the active layer is not limited to the n-type dopant and a p-type dopant can be used. In particular, if the dopant for the active layer is the p-type dopant, N (nitrogen) can be doped by plasma doping. Further, the active layer can be doped by both the n-type and p-type dopants.

While the respective semiconductor layers are epitaxially grown on the substrate 1 by MBE as described above, the present invention is not limited thereto and the semiconductor layers can be epitaxially grown on the substrate 1 by MOCVD (metal organic chemical vapor deposition).

While the electrode 11, for example, is contacted with the contact layer 9 in a stripe fashion to construct the semiconductor laser of stripe arrangement as described above, the present invention is not limited thereto and a semiconductor laser having a stripe portion can be fabricated by forming a current confinement portion on both sides of the stripe forming portion. Thus, the present invention is not limited to the above-mentioned arrangement and can be modified variously.

Further, the present invention is not limited to the semiconductor laser and can be applied to a light-emitting diode without resonator arrangement based on the stripe arrangement.

As described above, according to the II-VI group compound semiconductor device of the present invention, it is possible to form the semiconductor light-emitting device having excellent characteristics and whose life can be extended by doping the active layer 3 with at least one of n-type and p-type dopants.

If the active layer is made of ZnSe, then it becomes possible to form the semiconductor light-emitting device which can emit light of a short wavelength at room temperature. If other active layers, e.g., ZnCdSe and ZnSSe active layers are used, then the light-emitting efficiency can be improved more, the operation current can be lowered and the threshold current $I_{th}$ can be lowered. Thus, if the semiconductor light-emitting device according to the present invention is used as a light source of an optical recording and reproducing apparatus, then the recording can be made with high density and high resolution by light having the short wavelength. Furthermore, the power consumption can be reduced. Therefore, the semiconductor light-emitting device according to the present invention can bring various advantages in actual practice.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of generating laser radiation comprising:

a first step of providing a semiconductor laser structure comprised of a substrate;

at least a first cladding layer of a first conductivity type on the substrate;

an active layer on the first cladding layer; and a second cladding layer of a second conductivity type on the active layer, wherein at least said active layer is formed of a II–VI group compound semiconductor and said active layer contains a dopant at a concentration of greater than $1\times10^{15}$ cm$^{-3}$ and less than $5\times10^{16}$ cm$^{-3}$, and a second step of oscillating the semiconductor laser structure.

2. A method generating laser radiation according to claim 1, wherein said active layer is a ZnSe active layer.

3. A method generating laser radiation according to claim 1, wherein said active layer is a ZnCdSe active layer.

4. A method generating laser radiation according to claim 1, wherein said dopant of said active layer is Cl.

5. A method generating laser radiation according to claim 4, wherein a dope material of said Cl is $ZnCl_2$.

6. A method generating laser radiation according to claim 1, wherein the dopant of said active layer is nitrogen.

7. A method of generating laser radiation comprising:

a first step of providing a semiconductor laser structure comprised of a substrate;

at least a first cladding layer of a first conductivity type on the substrate;

an active layer on the first cladding layer; and a second cladding layer of a second conductivity type on the active layer, wherein said active layer is made of ZnSe, said first and second cladding layers are made of ZnMgSSe and said active layer contains a dopant at a concentration of greater than $1\times10^{15}$ cm$^{-3}$ and less than $5\times10^{16}$ cm$^{-3}$; and a second step of oscillating the semiconductor laser structure.

8. The method of generating laser radiation of claim 7, wherein the dopant of the active layer is Cl and the semiconductor device oscillates at room temperature.

9. A method of generating laser radiation comprising:

a first step of providing a semiconductor laser structure comprised of a substrate;

a first cladding layer on the substrate;

a first guide layer on the first cladding layer;

an active layer on the first guide layer;

a second guide layer on the active layer;

a second cladding layer on the second guide layer; and wherein said active layer contains a dopant at a concentration of greater than $1\times10^{15}$ cm$^{-3}$ and less than $5\times10^{16}$ cm$^{-3}$, and a second step of oscillating the semiconductor laser structure.

* * * * *